United States Patent
Kuo et al.

(10) Patent No.: US 11,304,347 B2
(45) Date of Patent: Apr. 12, 2022

(54) ELECTRONIC DEVICE

(71) Applicant: PEGATRON CORPORATION, Taipei (TW)

(72) Inventors: Yu-Ti Kuo, Taipei (TW); Chien-Yi Lee, Taipei (TW); Ching-Jen Wang, Taipei (TW)

(73) Assignee: PEGATRON CORPORATION, Taipei (TW)

( * ) Notice: Subject to any disclaimer, the term of this patent is extended or adjusted under 35 U.S.C. 154(b) by 0 days.

(21) Appl. No.: 17/196,763

(22) Filed: Mar. 9, 2021

(65) Prior Publication Data

US 2021/0368660 A1    Nov. 25, 2021

(30) Foreign Application Priority Data

May 19, 2020  (TW) ................................. 109206115

(51) Int. Cl.
*H05K 9/00*  (2006.01)
(52) U.S. Cl.
CPC ......... *H05K 9/0084* (2013.01); *H05K 9/0028* (2013.01); *H05K 9/0033* (2013.01)
(58) Field of Classification Search
CPC ............................ H05K 9/0028; H05K 9/0033
See application file for complete search history.

(56) References Cited

U.S. PATENT DOCUMENTS

| | | | |
|---|---|---|---|
| 2015/0014049 A1* | 1/2015 | Jang .................... | H05K 9/0028 174/377 |
| 2017/0181335 A1* | 6/2017 | Itou ..................... | H05K 9/0024 |
| 2018/0279516 A1* | 9/2018 | Lee ..................... | B32B 15/013 |
| 2019/0082562 A1* | 3/2019 | Mun .................... | H05K 1/181 |
| 2019/0364703 A1* | 11/2019 | Nozawa ............... | H05K 9/0026 |

FOREIGN PATENT DOCUMENTS

| | | |
|---|---|---|
| TW | 200803078 | 1/2008 |
| TW | 200810679 | 2/2008 |
| TW | M517418 | 2/2016 |

* cited by examiner

*Primary Examiner* — Hung V Ngo
(74) *Attorney, Agent, or Firm* — J.C. Patents (57) ABSTRACT

An electronic device, including a circuit board module, a first shielding plate and multiple first shielding plugs, are provided. The circuit board module includes a first surface, a second surface opposite to the first surface, a first electromagnetic wave source and multiple first clamp bases. The first electromagnetic wave source and the first clamp bases are located on the first surface. The first electromagnetic wave source is surrounded by the first clamp bases. The first shielding plugs are respectively inserted into the first clamp bases. The first shielding plate is disposed at a side of the first surface of the circuit board module and connected to the first shielding plugs. The first shielding plate and the first shielding plugs jointly cover the first electromagnetic wave source.

10 Claims, 7 Drawing Sheets

ELECTRONIC DEVICE

CROSS-REFERENCE TO RELATED APPLICATION

This application claims the priority benefit of Taiwan application serial no. 109206115, filed on May 19, 2020. The entirety of the above-mentioned patent application is hereby incorporated by reference herein and made a part of this specification.

BACKGROUND

Technical Field

This disclosure relates to an electronic device, and in particular to an electronic device with a good electromagnetic shielding capability.

Related Art

High-power electronic elements on a circuit board module generate electromagnetic waves during operation, and how to shield the electromagnetic interference (EMI) and electrostatic discharge (ESD) on the circuit board module remains a challenge for those skilled in the art.

SUMMARY

This disclosure provides an electronic device with a good electromagnetic shielding capability.

In an embodiment of the disclosure, the electronic device includes a circuit board module, a first shielding plate and multiple first shielding plugs. The circuit board module includes a first surface and a second surface opposite to each other, a first electromagnetic wave source, and multiple first clamp bases. The first electromagnetic wave source and the first clamp bases are disposed on the first surface, and the first electromagnetic wave source is surrounded by the first clamp bases. The first shielding plugs are respectively inserted into the first clamp bases. The first shielding plate is disposed at a side of the first surface of the circuit board module and connected to the first shielding plugs, so that the first shielding plate and the first shielding plugs jointly cover the first electromagnetic wave source.

Based on the above, the first shielding plugs of the electronic device according to the embodiment of the disclosure are connected to the first shielding plate and inserted into the first clamp bases. The first shielding plate and the first shielding plugs jointly cover the first electromagnetic wave source, and can shield the electromagnetic waves emitted by the first electromagnetic wave source.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the descriptions, serve to explain the principles of the disclosure.

DETAILED DESCRIPTION OF THE EMBODIMENTS

Figure 1:
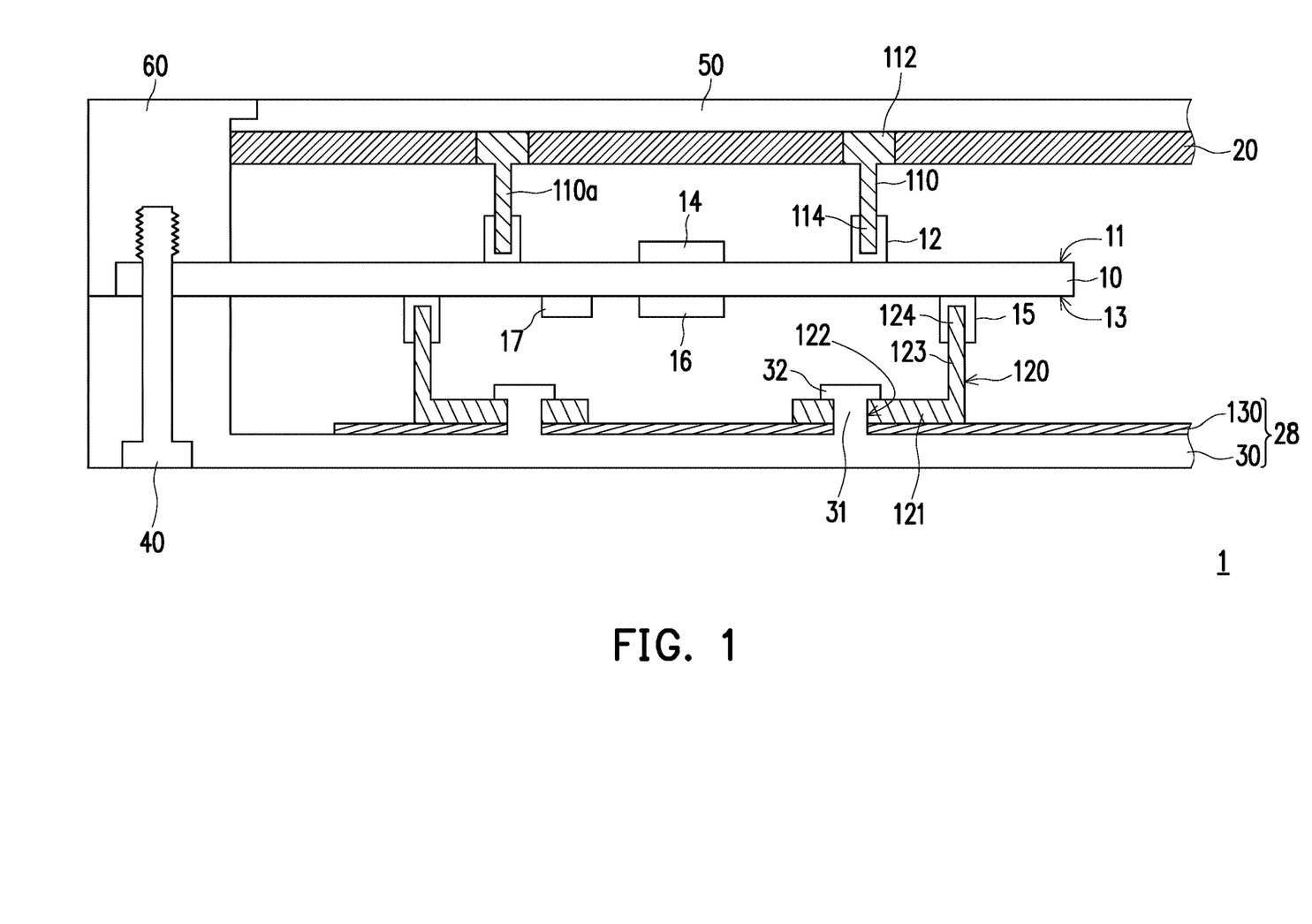
FIG. 1 is a schematic partial cross-sectional view of an electronic device according to an embodiment of the disclosure.

FIG. 1 is a schematic partial cross-sectional view of an electronic device according to an embodiment of the disclosure. With reference to FIG. 1, an electronic device 1 of the embodiment uses a notebook computer as an example and FIG. 1 only schematically illustrates a lower body of the notebook computer. In other embodiments, the electronic device 1 may also be a tablet computer or a thin TV. However, the type of the electronic device 1 is not limited thereto.

The electronic device 1 of the embodiment includes a circuit board module 10, a first shielding plate 20 and multiple first shielding plugs 110 and 110a. The circuit board module 10 includes a first surface 11 and a second surface 13 opposite to each other. The first surface 11 is, for example, an upper surface, and the second surface 13 is, for example, a lower surface. The circuit board module 10 includes a first electromagnetic wave source 14 located on the first surface 11 and multiple first clamp bases 12 located beside the first electromagnetic wave source 14 and surrounding the first electromagnetic wave source 14.

In the embodiment, the first electromagnetic wave source 14 uses a central processing unit as an example, however, the type of the first electromagnetic wave source 14 is not limited thereto. In other embodiments, the first electromagnetic wave source 14 may also be an image processor or a memory component.

The first shielding plugs 110 and 110a are respectively inserted into the first clamp bases 12. The first shielding plate 20 is disposed at a side (above) of the first surface 11 of the circuit board module 10, connected to the first shielding plugs 110 and 110a, and covers the first electromagnetic wave source 14. In detail, the first shielding plugs 110 and 110a are uprightly fixed to the first shielding plate 20, and first plug connection ends 114 of the first shielding plugs 110 and 110a are inserted into the first clamp bases 12. The shielding plate 20 and the first shielding plugs 110 and 110a jointly cover the first electromagnetic wave source 14.

Figure 2:
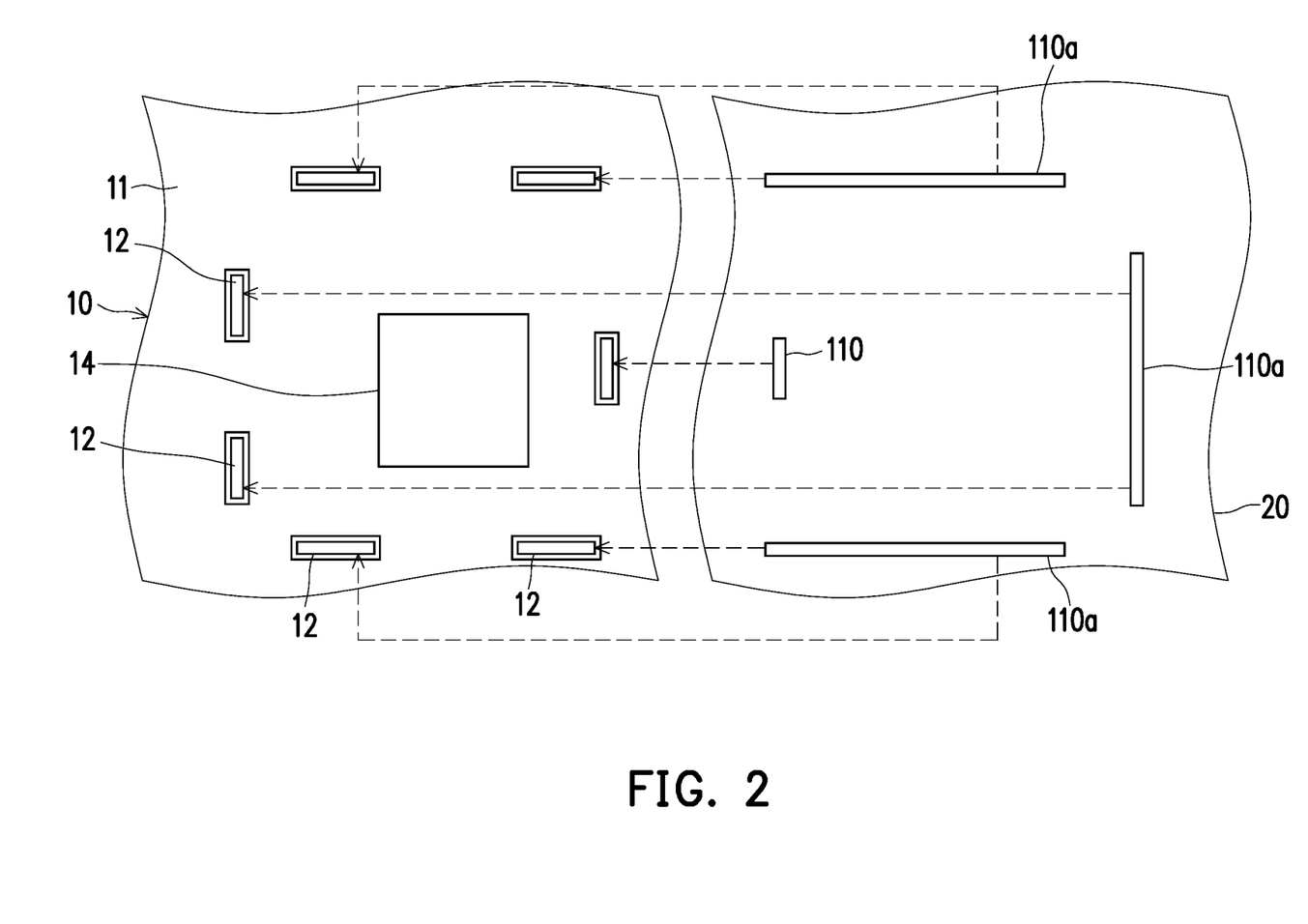
FIG. 2 is a partial top view of the first shielding plate and the first shielding plugs in FIG. 1 unfolded on the circuit board module.

FIG. 2 is a partial top view of the first shielding plate and the first shielding plugs in FIG. 1 unfolded on the circuit board module. That is to say, in FIG. 2, the first surface 11 of the circuit board module 10 and a lower surface (a surface face the first surface 11 of the circuit board module 10) of the first shielding plate 20 may be seen. In an actual configuration, the first surface 11 of the circuit board module 10 faces the lower surface of the first shielding plate 20. With reference to FIGS. 1 and 2, in the embodiment, the first clamp bases 12 are located on at least two sides of the first electromagnetic wave source 14, for example, four sides.

In addition, in the embodiment, the first shielding plugs 110 and 110a may include different shapes, so that the number of the first shielding plugs 110 and 110a may or may not correspond to the number of the first clamp bases 12. As shown in FIG. 2, in the embodiment, one of the first shielding plugs 110a corresponds to two of the first clamp bases 12, and one of the first shielding plugs 110 corresponds to one of the first clamp bases 12. However, the form of the first shielding plugs 110 and 110a is not limited thereto.

It should be noted that the first shielding plugs 110 may be joined together to enclose the first electromagnetic wave source 14 in a closed manner, or, there may be gaps between the first shielding plugs 110 such that the first electromagnetic wave source 14 is surrounded at intervals. In practical applications, a designer may design position and width of the first shielding plugs 110 according to frequency band of an electromagnetic wave to be shielded, because as long as the frequency band of the electromagnetic wave of the first electromagnetic wave source 14 is not resonating with the gaps between the first shielding plugs 110, there will be no impact on electromagnetic shielding capability of the electronic device 1.

It is worth mentioning that, with reference to FIG. 1 again, in the embodiment, the first shielding plate 20 is a keyboard reinforcement plate. In general, the keyboard reinforcement plate is disposed below the keyboard 50 and configured to strengthen metal parts of the keyboard 50. In the embodiment, the electronic device 1 uses the keyboard reinforcement plate originally disposed below the keyboard 50 as the first shielding plate 20 to shield the electromagnetic waves emitted by the first electromagnetic wave source 14. A conventional shielding plate is an additional metal plate, which costs an additional cost and occupies an additional thickness. Therefore, the electronic device 1 of the embodiment can be capable of an electromagnetic shielding function while maintaining an original thickness.

Since the keyboard reinforcement plate of the embodiment serves as the first shielding plate 20, the keyboard reinforcement plate needs to cover the first electromagnetic wave source 14. The designer may change a shape or position of the keyboard reinforcement plate to position it above the first electromagnetic wave source 14 when the original keyboard reinforcement plate is not located above the first electromagnetic wave source 14, thereby providing the shielding capability while retaining its original function, and allowing the electronic device 1 to still maintain its original thickness.

In other embodiments, the first shielding plate 20 may also be a keyboard bracket, which is used to carry keys and is pivotally connected to a scissor foot structure of each of the keys, or, the first shielding plate 20 may also be a screen bracket or a casing. The casing may directly serve as the first shielding plate 20, if it is a metal casing. Alternatively, a metal layer may be electroplated or sputtered onto an inner surface of the casing to serve as the first shielding plate 20, if the casing is an insulating casing (for example, a plastic material).

Figure 3A:
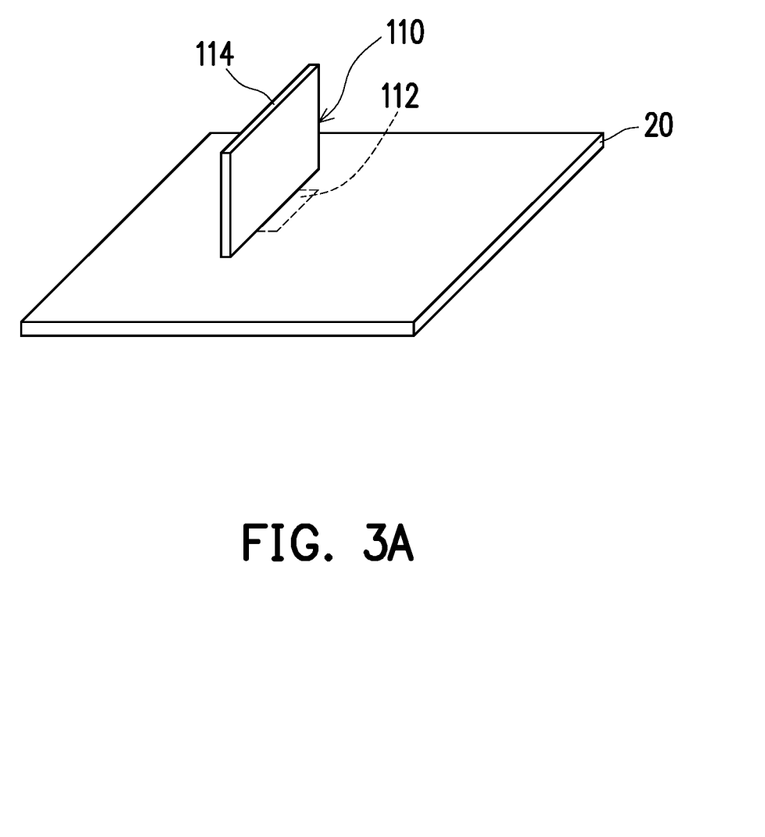
FIG. 3A is a three-dimensional schematic view of the first shielding plate and the first shielding plug of the electronic device in FIG. 1.
Figure 3B:
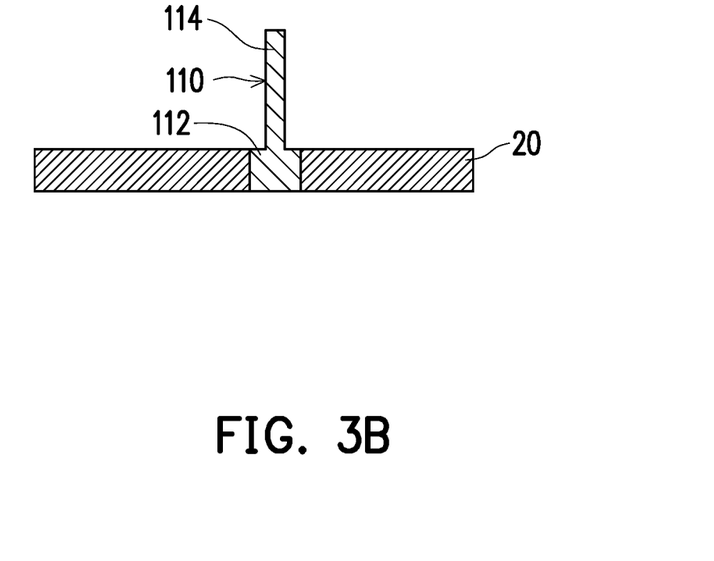
FIG. 3B is a schematic cross-sectional view of FIG. 3A.

FIG. 3A is a three-dimensional schematic view of the first shielding plate and the first shielding plugs of the electronic device in FIG. 1. FIG. 3B is a schematic cross-sectional view of FIG. 3A. With reference to FIGS. 3A and 3B, in the embodiment, the first shielding plate 20 is a metal plate, the first shielding plugs 110 are metal sheets, and the first shielding plug 110 is, for example, riveted to the first shielding plate 20 through a riveting part 112. In other embodiments, the first shielding plugs 110 may also be welded, locked or bonded to the first shielding plate 20, and a manner in which the first shielding plug 110 is fixed to the first shielding plate 20 is not limited thereto.

That is, the designer may fix the first shielding plugs 110 to the first shielding plate 20 in advance at a position on the first shielding plate 20 (for example, the keyboard reinforcement plate) corresponding to the first clamp bases 12 (in FIG. 2), such that during subsequent assembling of the first shielding plate 20 and the circuit board module 10, the first shielding plug 110s are inserted into the first clamp bases 12 of the circuit board module 10.

With reference to FIG. 1 again, in the embodiment, the circuit board module 10 may selectively include a second electromagnetic wave source 16 located on the second surface 13 and multiple second clamp bases 15 located beside the second electromagnetic wave source 16 and surrounding the second electromagnetic wave source 16. In the embodiment, the second electromagnetic wave source 16 takes an image processor as an example, and a memory chip 17 is also disposed around the image processor. However, the type of the second electromagnetic wave source 16 is not limited thereto.

In the embodiment, a position of the first electromagnetic wave source 14 on the first surface 11 corresponds to (overlaps or is close to) a position of the second electromagnetic wave source 16 on the second surface 13. However, in other embodiments, the electromagnetic wave source 14 and the second electromagnetic wave source 16 may also be staggered. That is, the position of the first electromagnetic wave source 14 on the first surface 11 may not correspond to the position of the second electromagnetic wave source 16 on the second surface 13.

In the embodiment, the electronic device 1 further includes a second shielding plate 28 and multiple second shielding plugs 120. The second shielding plugs 120 are respectively inserted into the second clamp bases 15. The second shielding plate 28 is disposed at a side (lower side) of the second surface 13 of the circuit board module 10, connected to the second shielding plugs 120, and covers the second electromagnetic wave source 16. The second shielding plugs 120 are uprightly fixed to the second shielding plate 28, and second plug ends 124 of the second shielding plugs 120 are inserted into the second clamp bases 15. The second shielding plate 28 and the second shielding plugs 120 jointly cover the second electromagnetic wave source 16.

Figure 4:
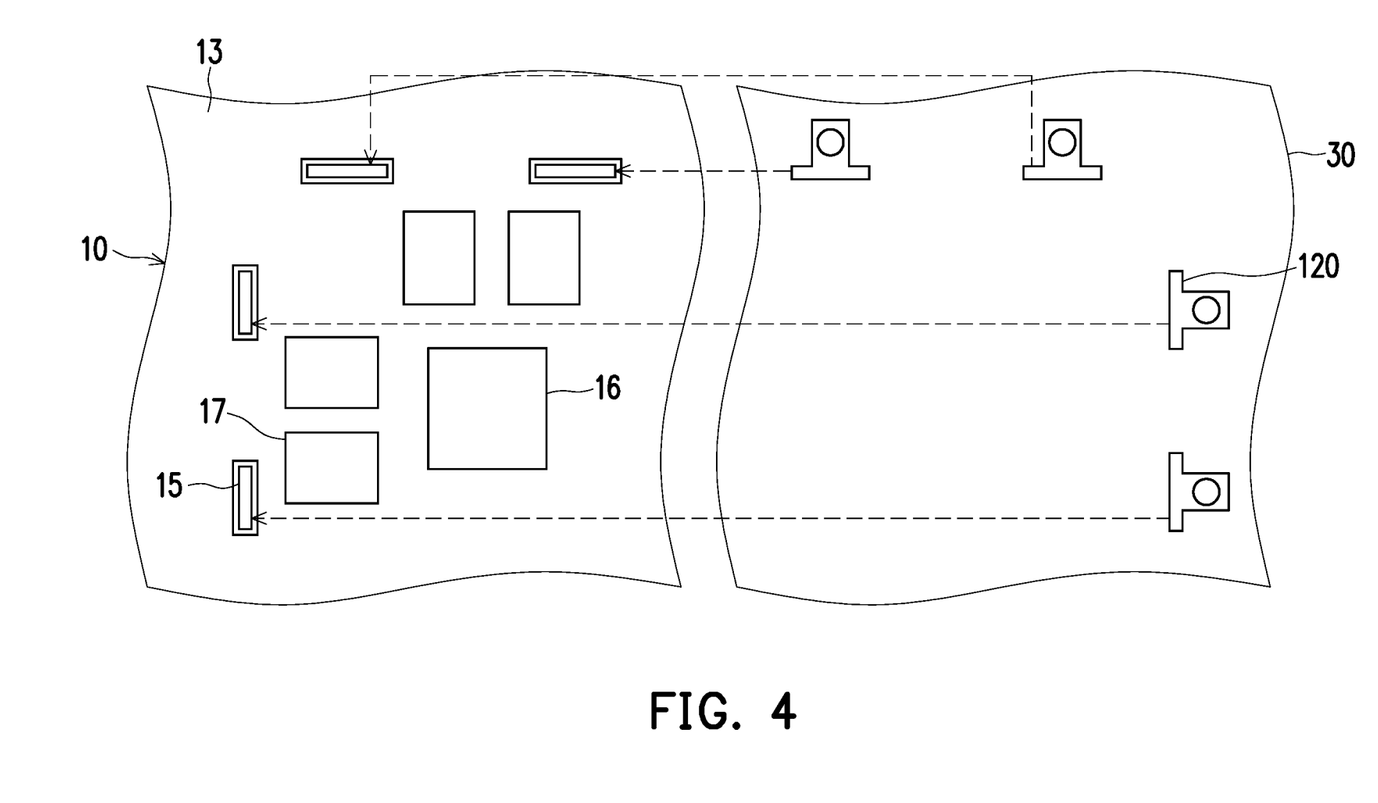
FIG. 4 is a partial bottom view of the second shielding plate and the second shielding plug in FIG. 1 unfolded on the circuit board module.

FIG. 4 is a partial bottom view of the second shielding plate and second shielding plug in FIG. 1 unfolded on the circuit board module. That is to say, in FIG. 4, the second surface 13 of the circuit board module 10 and an upper surface (a surface face the second surface 13 of the circuit board module 10) of the second shielding plate 28 may be seen. In the actual configuration, the second surface 13 of the circuit board module 10 faces the upper surface of the second shielding plate 28. With reference to FIG. 4, in the embodiment, the second clamp bases 15 are disposed on two adjacent sides of the second electromagnetic wave source 16, and the number of the second shielding plugs 120 corresponds to the number of the second clamp bases 15. However, the position of the second clamp base 15 and the form of the second shielding plug 120 are not limited thereto.

Figure 5A:
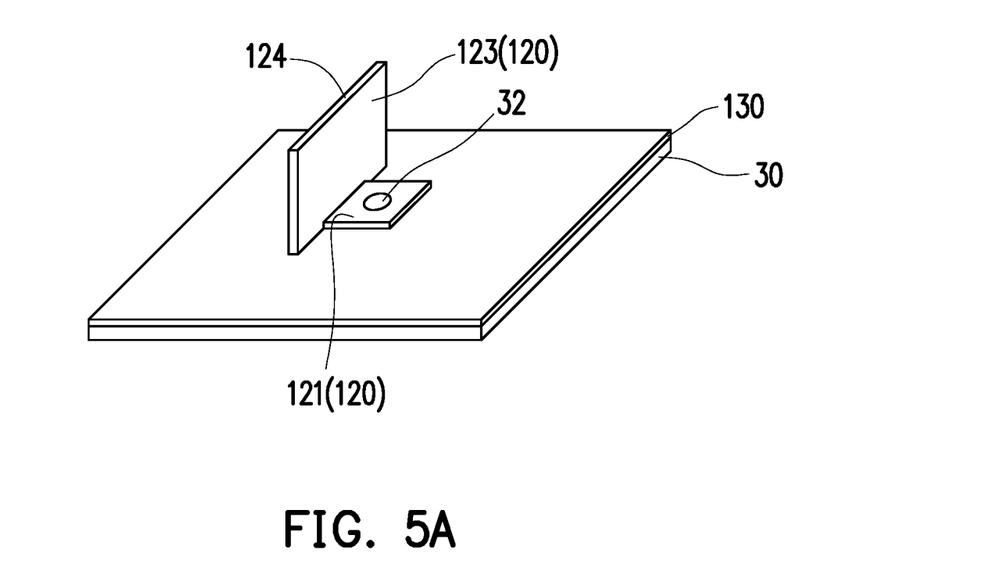
FIG. 5A is a three-dimensional schematic view of the second shielding plate and the second shielding plug of the electronic device in FIG. 1.
Figure 5B:
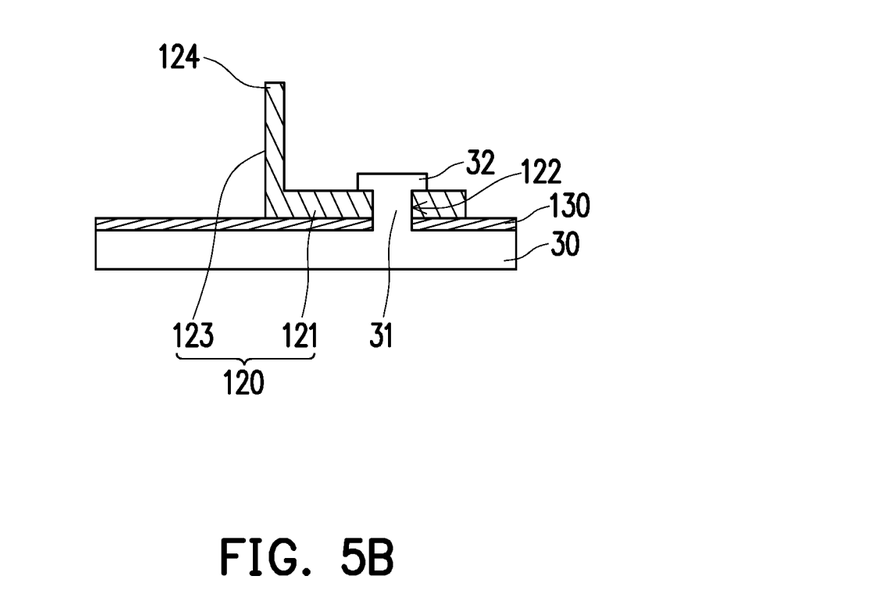
FIG. 5B is a schematic cross-sectional view of FIG. 5A.

FIG. 5A is a three-dimensional schematic view of the second shielding plate and the second shielding plug of the electronic device 1 in FIG. 1. FIG. 5B is a schematic cross-sectional view of FIG. 5A. With reference to FIGS. 1, 5A and 5B, in the embodiment, the second shielding plate 28 (as marked in FIG. 1) includes an insulating substrate 30 and a metal coating layer 130 disposed on the insulating substrate 30. The insulating substrate 30 is, for example, an outer casing (bottom casing) of the lower body of the notebook computer, which is a plastic piece, and an inner layer of the insulating substrate 30 may be disposed with the metal coating layer 130 to have the electromagnetic shielding capability. Of course, the type of the second shielding plate 28 is not limited thereto.

In the embodiment, the second shielding plug 120 includes a first part 121 and a second part 123 connected in a bend manner. The first part 121 and the second part 123 are, for example, L-shaped. In detail, the first part 121 is in contact with the insulating substrate 30 and includes a perforation 122. One end of the second part 123 is connected to the first part 121, the second part 123 is upright on the insulating substrate 30, and another end of the second part 123 is inserted into the corresponding second clamp base 15 (as shown in FIG. 1).

The insulating substrate 30 includes a fixed column 31, and a material of the fixed column 31 is, for example, hot melt adhesive. The fixed column 31 passes through the perforation 122, a cap part 32 of the fixed column 31 is located on the first part 121, and size of the cap part 32 is greater than size of the perforation 122 to fix the second shielding plug 120 to the insulating substrate 30. In other embodiments, the second shielding plug 120 may also be bonded or locked to the second shielding plate 30, and a manner in which the second shielding plug 120 is fixed to the insulating substrate 30 is not limited thereto.

Similarly, in the embodiment, the electronic device 1 uses the original outer casing (bottom casing) of the lower body, and the metal coating layer 130 being disposed on an inner surface of the outer casing to jointly serve as the second shielding plate 28, so as to shield the electromagnetic waves emitted by the second electromagnetic wave source 16. Compared with the conventional shielding plate, which is an additional metal plate and costs an additional cost and occupies an additional thickness, the electronic device 1 of the embodiment can achieve the electromagnetic shielding function while maintaining the original thickness.

It is worth mentioning that in the embodiment, the designs of the first clamp base 12 to clamp the first shielding plugs 110 and 110a and the second clamp base 15 to clamp the second shielding plug 120 may provide a first stability between the first shielding plate 20 and the circuit board module 10, and between the second shielding plate 28 and the circuit board module 10.

In addition, in the embodiment, since the first shielding plate 20 and the second shielding plate 28 are the original structures of the electronic device 1, the electronic device 1 is originally disposed with a fixed structure to fix relative positions of the first shielding plate 20 and the circuit board module 10 and relative positions of the second shielding plate 28 and the circuit board module 10.

In detail, with reference to FIG. 1 again, in the embodiment, an upper casing 60, the circuit board module 10 and the second shielding plate 28 (casing) are fixed by a locking piece 40, and the keyboard 50 is limited by the upper casing 60 and cannot move upwards. In addition, the first shielding plate 20 is the keyboard reinforcement plate, which is originally fixed below the keyboard 50. Therefore, the relative positions of the first shielding plate 20 and the circuit board module 10 and the relative positions of the second shielding plate 28 and the circuit board module 10 are fixed to provide a second stability. Therefore, the first shielding plugs 110 and the second shielding plug 120 are more difficult to loosen from the first clamp base 12 and the second clamp base 15, thereby having good stability. In other embodiments, the first shielding plate 20 and the circuit board module 10 are fixed by another locking piece (not shown).

Figure 6:
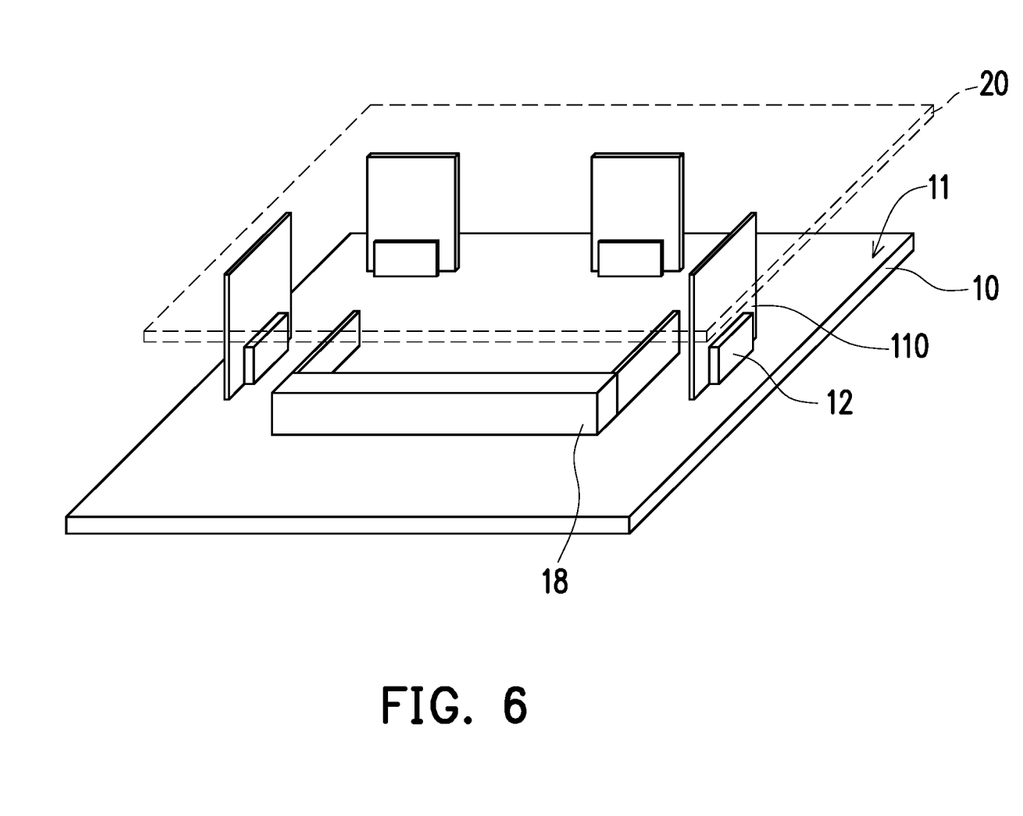
FIG. 6 is a three-dimensional schematic view of the first shielding plate and the first shielding plug covering a memory slot.
Figure 7:
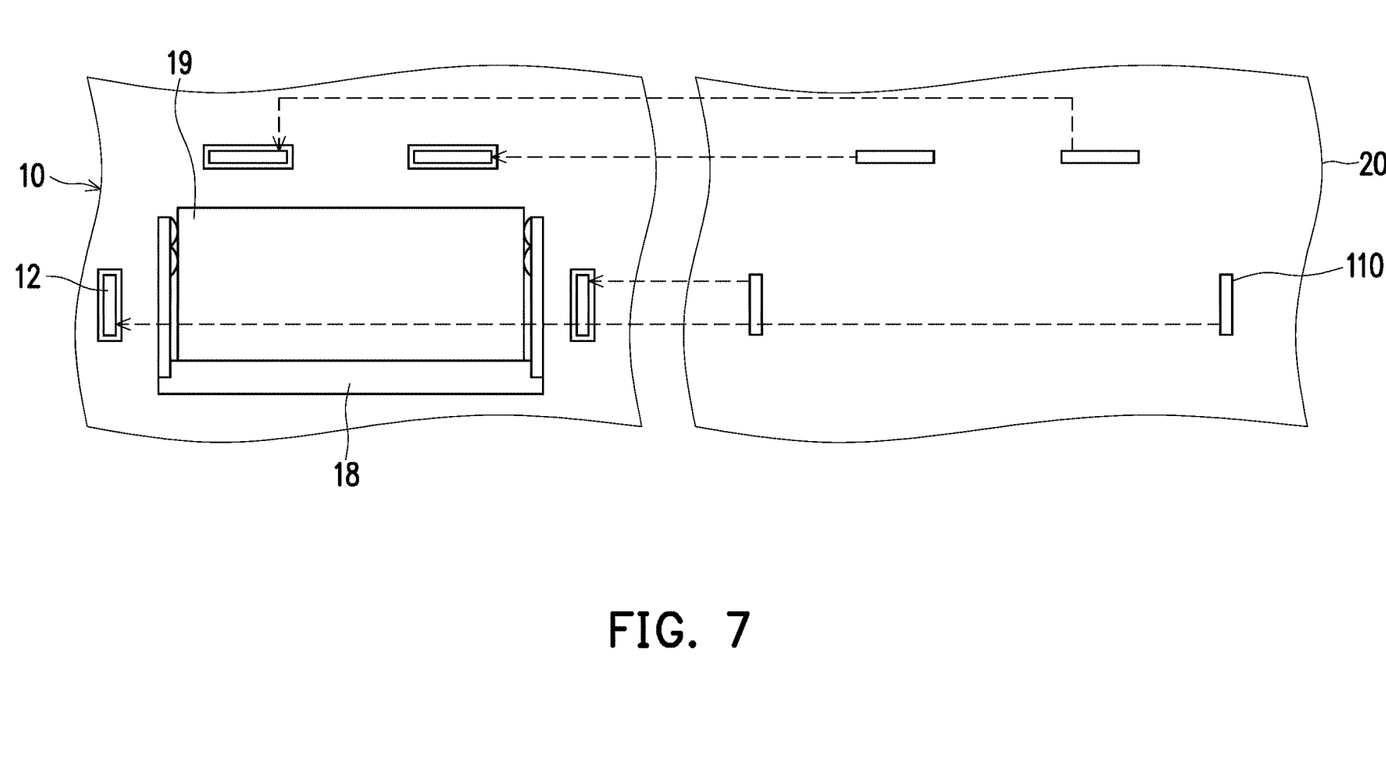
FIG. 7 is a partial top view of the first shielding plate and the first shielding plug in FIG. 6 unfolded on the circuit board module.

The type of the electromagnetic wave source and the disposition of the shielding structure are not limited thereto. FIG. 6 is a three-dimensional schematic view of the first shielding plate and the first shielding plug covering a memory slot. FIG. 7 is a partial top view of the first shielding plate and the first shielding plug in FIG. 6 unfolded on the circuit board module. With reference to FIGS. 6 and 7, in the embodiment, the first clamp bases 12 may be disposed around the memory slot 18 (for example, on three sides of a memory slot 18), and the electromagnetic wave source may be a memory component 19 inserted in the memory slot 18. The first shielding plate 20 and the first shielding plugs 110 may also be configured to shield the electromagnetic waves emitted by the memory component 19.

In summary, the first shielding plugs of the electronic device according to the embodiment of the disclosure are connected to the first shielding plate and inserted into the first clamp bases. The first shielding plate and the first shielding plugs jointly cover the first electromagnetic wave source, and can shield the electromagnetic waves emitted by the first electromagnetic wave source. In some embodiments, the electronic device uses the original structures (one of the keyboard bracket, the keyboard reinforcement plate, the screen bracket, and the outer casing) as a first shielding cover, which not only eliminates additional cost due to an additional mold, but also maintains the overall thickness of the electronic device.

Although the disclosure has been disclosed with the foregoing exemplary embodiments, it is not intended to limit the disclosure. Any person skilled in the art can make various changes and modifications within the spirit and scope of the disclosure. Accordingly, the scope of the disclosure is defined by the claims appended hereto and their equivalents.

What is claimed is:
1. An electronic device, comprising:
a circuit board module, comprising a first surface, a second surface opposite to the first surface, a first electromagnetic wave source, a plurality of first clamp bases, a second electromagnetic wave source, and a plurality of second clamp bases, wherein the first electromagnetic wave source and the first clamp bases are disposed on the first surface, the first clamp bases surround the first electromagnetic wave source, the second electromagnetic wave source and the second clamp bases are disposed on the second surface, and the second clamp bases surround the second electromagnetic wave source;
a plurality of first shielding plugs, respectively inserted into the first clamp bases;
a first shielding plate, disposed at a side of the first surface of the circuit board module and connected to the first shielding plugs, wherein the first shielding plate and the first shielding plugs jointly cover the first electromagnetic wave source;
a plurality of second shielding plugs, respectively inserted into the second clamp bases; and
a second shielding plate, disposed at a side of the second surface of the circuit board module and connected to the second shielding plugs, wherein the second shield- ing plate and the second shielding plugs jointly cover the second electromagnetic wave source.

2. The electronic device according to claim 1, wherein the first shielding plate is a keyboard bracket, a keyboard reinforcement plate, a screen bracket or a metal casing.

3. The electronic device according to claim 1, wherein the first shielding plugs are riveted, welded, locked or bonded to the first shielding plate.

4. The electronic device according to claim 1, wherein the second shielding plate comprises an insulating substrate and a metal coating layer disposed on the insulating substrate, wherein the metal coating layer faces the second surface.

5. The electronic device according to claim 4, wherein each of the second shielding plugs comprises a first part and a second part, the first part and the second part are connected in a bend manner, the first part is in contact with the second shielding plate and comprises a perforation, one end of the second part is connected to the first part, another end of the second part is inserted into a corresponding second clamp base, the insulating substrate comprises a fixed column, and the fixed column passes through the perforation to fix the second shielding plug to the second shielding plate.

6. The electronic device according to claim 5, wherein a material of the fixed column comprises hot melt glue.

7. The electronic device according to claim 1, wherein the first shielding plate and the circuit board module are fixed by a locking piece.

8. The electronic device according to claim 7, wherein the second shielding plate and the circuit board module are fixed by another locking piece.

9. The electronic device according to claim 1, wherein the first electromagnetic wave source comprises a central processing unit, an image processor, or a memory component.

10. The electronic device according to claim 1, wherein the first clamp bases are located on at least two sides of the first electromagnetic wave source.

* * * * *